US012573451B2

(12) United States Patent
    Wang

(10) Patent No.: US 12,573,451 B2
(45) Date of Patent: Mar. 10, 2026

(54) FOUR-TRANSISTOR STATIC RANDOM ACCESS MEMORY CELL WITH ENHANCED DATA RETENTION

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 130 days.

(21) Appl. No.: 18/661,126

(22) Filed: May 10, 2024

(65) Prior Publication Data

US 2025/0349352 A1     Nov. 13, 2025

(51) Int. Cl.
    *G11C 11/419*     (2006.01)
    *G11C 5/06*       (2006.01)
    *G11C 11/412*     (2006.01)
    *G11C 14/00*      (2006.01)
    *H10B 10/00*      (2023.01)
    *H10D 84/85*      (2025.01)
    *H10D 84/90*      (2025.01)

(52) U.S. Cl.
    CPC ............ *G11C 11/419* (2013.01); *G11C 5/063* (2013.01); *G11C 11/412* (2013.01); *G11C 14/0054* (2013.01); *H10B 10/12* (2023.02); *H10D 84/856* (2025.01); *H10D 84/916* (2025.01); *G11C 2211/4066* (2013.01)

(58) Field of Classification Search
    CPC ............ G11C 14/00; G11C 2011/4066; G11C 11/419; G11C 5/063; G11C 11/412; H10B 10/12; H10D 84/856; H10D 84/916
    See application file for complete search history.

(56) References Cited

U.S. PATENT DOCUMENTS

| | | | | |
|---|---|---|---|---|
| 10,614,877 B1 * | 4/2020 | Chu | ......................... | G11C 7/04 |
| 2008/0025109 A1 * | 1/2008 | Lee | ....................... | H10B 10/00 |
| | | | | 257/E27.099 |
| 2020/0235105 A1 * | 7/2020 | Sharma | ................. | G11C 11/419 |
| 2023/0197160 A1 * | 6/2023 | Sanuki | ................. | G11C 11/418 |
| | | | | 365/233.5 |
| 2024/0282366 A1 * | 8/2024 | Jacob | .................... | H10B 10/00 |

OTHER PUBLICATIONS

U.S. Appl. No. 18/418,060, filed Jan. 19, 2024.

\* cited by examiner

*Primary Examiner* — Donald HB Braswell
(74) *Attorney, Agent, or Firm* — Muncy, Geissler, Olds & Lowe, P.C.

(57)                ABSTRACT

A SRAM cell comprising two PMOS transistors and two NMOS transistors is fabricated with CMOS process technology. The PMOS transistors are coupled to a supply voltage rail, a first storage node and a second storage node. The NMOS transistors are responsive to a word line and coupled to the first and the second storage nodes and a bit line pair. When the two NMOS transistors are turned off, a floating voltage at the first storage node rises from a ground voltage and stabilizes at a steady-state voltage $V_{stdf}$ and a difference voltage ($V_{DD}-V_{stdf}$) between the first and the second storage nodes is greater than a predefined voltage so that a data bit stored in the SRAM cell is read out correctly in a following data read period, where $0<V_{stdf}<V_{DD}$.

15 Claims, 16 Drawing Sheets

First metal

Metal contacts

Poly silicon gates

Nwell areas (801)

Silicon active areas

First metal

Metal contacts

Poly silicon gates

Nwell areas

Silicon active areas

First metal

Metal contacts

Poly silicon gates

Nwell areas (250)

Silicon active areas

First metal

Metal contacts

Poly silicon gates

Nwell areas (150)

Silicon active areas

Metal contacts

Poly silicon gates

Nwell areas(150)

Silicon active areas

FOUR-TRANSISTOR STATIC RANDOM ACCESS MEMORY CELL WITH ENHANCED DATA RETENTION

BACKGROUND OF THE INVENTION

Field of the Invention

The invention relates to four-Transistor (4T) Static Random Access Memory (SRAM) cell with enhanced data retention. The 4T-SRAM cells, each comprising two p-type Metal Oxide Semiconductor Field Transistor (MOSFET) devices (21, 22 in FIG. 2) for a bit of data storage and two n-type MOSFET devices (23, 24 in FIG. 2) for access switches, are configured to form memory arrays for digital memory storage in Integrated Circuit (IC) chips. In particular, the 4T SRAM cells of the invention are designed to improve the read reliability by enhancing the cell data retention without the requirement of refresh operation.

Description of the Related Art

Semiconductor memories have been broadly applied to electronic systems. Electronic systems require semiconductor memories for storing instructions and data from the basic functions of controls to the complex computing data processes. Semiconductor memories can be cataloged as volatile memories and non-volatile memories. The volatile memories including Static Random Access Memory (SRAM) and Dynamic Random Access Memory (DRAM) lose their stored data after the memory's powers off while the non-volatile memories such as Read Only Memory (ROM), Electrical Erasable Programmable Read Only Memory (EEPROM) and flash still keep their stored data even without the memory power.

Since computing processors run at very high frequency clock speeds (tens of MHz~tens of GHz), the access times for reading data and altering data in memory have to be compatible with the computing speeds of computing processors. The volatile SRAM and DRAM are the memory of choices for computer processors due to their fast random memory access time for read/write operations. DRAM cell simply consisting of one MOSFET device for the access switch and one capacitor for a bit of storage can be fabricated with DRAM process technology to very high densities with very low fabrication cost. However, DRAM requires to constantly refresh leading to high power consumption. Since SRAM does not require data refresh the power consumption for SRAM is much less than those for DRAM. Furthermore SRAM is fabricated with the CMOS (Complementary Metal Oxide Semiconductor) process technology, the same process technology for fabricating digital processor Integrated Circuits (IC). Therefore, SRAM is usually embedded with digital processor for the memory requirement in IC chips. However, since the conventional SRAM cell for one bit of storage comprises 6 MOSFET devices occupying much larger silicon area than the conventional DRAM cell (one MOSFET device and one capacitor), the per-bit-storage cost for SRAM is much higher than that for DRAM. Therefore, it is very desirable to reduce the cell sizes of SRAM by applying less numbers of MOSFET devices to improve the memory density and to lower the per-bit-storage cost in digital processor IC chips. As shown in FIG. 1 the conventional SRAM cell 100 consists of six MOSFET devices: two N-type MOSFET devices 13, 14 for access switches and a cross-coupled inverter latch: (PMOSFET device 11 and NMOSFET device 15) and (PMOSFET device 12 and MOSFET device 16) for a bit of data storage, where the cross-coupled inverter latch forms the two storage nodes n1 and n2, respectively. As shown in FIG. 2 the 4T SRAM cell 200 consists of four MOSFET devices: two N-type MOSFET devices 23, 24 for access switches and two cross-coupled P-type MOSFET devices 21, 22 for a bit of data storage, where the drain electrodes of the cross-coupled PMOSFET devices 21, 22 form the two storage nodes n3 and n4, respectively. For SRAM per-bit-storage cost reduction, the size of the 4T (four MOSFET devices) SRAM cell 200 in FIG. 2 is usually about 25%~35% smaller than that of the conventional 6T SRAM cell 100 in FIG. 1 fabricated with a specific CMOS fabrication process technology node. Although the 4T SRAM cell 200 can save per-bit-storage cost for less numbers of MOSFET devices, reliable reading the stored data from the 4T SRAM cells still remains the most critical issue for the broad application of 4T SRAM in IC chips.

A 4T SRAM cell 200 stores one bit of datum by setting asymmetrical voltage potentials such as $V_{DD}$ and $V_{SS}$ (ground voltage) for data "1", and $V_{SS}$ (ground voltage) and $V_{DD}$ for datum "0" respectively at the cell's two storage nodes n3 and n4. The stored datum in the 4T SRAM cell 200 is then read back by sensing the asymmetrical voltage potentials at the SRAM cell's two storage nodes n3 and n4. For the 6T SRAM data storage, the cross-coupled inverter latch (inverter devices 12, 16 and inverter devices 11, 15) of the 6T SRAM cell 100 in FIG. 1 always keep one storage node connected to $V_{DD}$ with the other storage node connected to $V_{SS}$ after the datum has been stored in the 6T SRAM cell 100. It is straightforward to apply the conventional SRAM sensing circuits to read out the data from the 6T SRAM cell 100. While writing datum into the 4T SRAM cell 200 in FIG. 2, the storage nodes n3 and n4 are initially set to the voltage potentials $V_{DD}$ and $V_{SS}$ (ground voltage) for data "1", and the voltage potentials $V_{SS}$ (ground voltage) and $V_{DD}$ for "0", respectively with the write circuit in the previous U.S. patent application Ser. No. 18/418,060. However after writing into the 4T SRAM cell 200 in the data retention period with the access transistors 23, 24 off, unlike the 6T SRAM cell 100, the voltage potential at one storage node in 4T SRAM cell 200 in FIG. 2 is always floating without connecting to the ground voltage $V_{SS}$.

To minimize the read error for the floating storage node in the 4T SRAM 200, the read circuit in the previous U.S. patent application Ser. No. 18/418,060 is designed to read datum from the floating voltage potential at one storage node and $V_{DD}$ at the other storage node in the 4T SRAM cell 200 by (1) discharging the residual charges on the connecting bit-line BL and complementary bit-line $\overline{BL}$ prior to accessing a 4T SRAM cell 200 for avoiding the unwanted read interference, (2) sensing the differential voltage potential between the connecting bit-line BL and the connecting complementary bit-line $\overline{BL}$ passed from cell's two storage nodes, and (3) simultaneously refreshing the original data voltage potentials ($V_{DD}$ and $V_{SS}$) at the two storage nodes during the data read period. Meanwhile as illustrated in FIGS. 3A-3B, for data "0" storage in the data retention period with the access transistors 33, 34 off (i.e., the word-line W is not activated), the voltage potential $V_f$ at the floating storage node N1 is gradually rising from the initially set ground voltage $V_{SS}$ and then stabilizes at a steady-state voltage potential $V_{stdf}$ between the high voltage $V_{DD}$ and the ground voltage $V_{SS}$; in the data read period, the access transistors 33, 34 is turned on (i.e., the wordline W is activated) to read out the stored bit in 4T SRAM cell 300. A steady-state floating storage node voltage potential $V_{stdf}$ at the storage node N1 of the 4T-SRAM cell 300 is obtained by the detailed leakage current balance at the storage node N1 between the pull-up leakage current $I_{lkup}(V_{DD}-V_{stdf})$ toward the high voltage $V_{DD}$, that is, $I_{lkup}(V_{DD}-V_{stdf})$=the PMOS-FET device 32 channel diffusion leakage current $I_{pch}(V_{DD}-V_{stdf})$ 320+the reverse P-drain/Nwell junction leakage current $I_{prd}(V_{DD}-V_{stdf})$ 325, and the pull-down leakage current $I_{lkdn}(V_{stdf})$ 342 toward the ground voltage $V_{SS}$, that is, $I_{lkdn}(V_{stdf})$ 342=the reverse N-drain/P-substrate junction leakage current InD from the drain electrode 341 of the access NMOSFET device 34 as illustrated in FIG. 3A for data "0" storage.

In order to read the datum from the 4T SRAM cell 300 correctly, the steady-state floating storage node voltage $V_{stdf}$ at the floating storage node N1 shall be as low as possible away from high voltage rail $V_{DD}$ toward the ground voltage $V_{SS}$ such that the designed read circuit in the previous U.S. patent application Ser. No. 18/418,060 can sense a significant differential voltage between the steady-state floating storage node voltage potential $V_{staf}$ and the high voltage potential $V_{DD}$ at the two storage nodes N1, N2 of the 4T SRAM cell 300. In this invention, the methods of obtaining a low steady-state floating storage node voltage $V_{stdf}$ at the floating storage node in the 4T SRAM cell for a greater read margin are disclosed.

SUMMARY OF THE INVENTION

The read circuit in the previous U.S. patent application Ser. No. 18/418,060 can resolve the ideal differential voltage of hundreds to tens micro-volts. However, considering the environmental noise and interference, the read circuit in the previous U.S. patent application Ser. No. 18/418,060 is able to resolve the safe margin of tens milli-volt range for the differential voltage with certainty. Furthermore, the differential voltages between the bitline and complementary bitline attached to the read circuit from the cell's storage nodes will be reduced from the differential voltages between the storage nodes due to the charge sharing between storage nodes and bitlines, while accessing the selected 4T SRAM cell for reading out the stored datum (i.e., in the data read period). The differential voltage signals between the bitlines can be estimated by the capacitance ratio of the attached bitlines and the cell's storage nodes. For example, for a capacitance ratio of 10:1 for bitlines and storage nodes, the differential voltage between the storage nodes in the 4T SRAM cell shall be at least 100 milli-volts. Therefore, the resolvable differential voltage for the read circuit with some margins shall be at least 100 milli-volts for this scenario for the worse margin of $(V_{DD}-V_{stdf})$ to read out the stored data in the 4T SRAM cells correctly in the data read period. In the data read period, the differential voltages between bitline and complementary bitline for the proper read margin for the read circuits disclosed in the previous application shall be designed to be around the fractions of $V_{DD}$ (i.e., less than $V_{DD}$ and greater than and equal to $(V_{DD}/10)$), which are in the range of volts for IC chips.

The steady-state floating storage node voltage $V_{stdf}$ is determined by the detailed leakage current balance of pull-up leakage current $I_{lkup}(V_{DD}-V_{stdf})$ and the pull-down leakage current $I_{lkdn}(V_{stdf})$. In the data retention period with the 4T SRAM access transistors (33, 34 in FIG. 3A) off, the voltage potential at the floating storage node is gradually rising from the initially set ground voltage $V_{SS}$=0 V and then stabilizes at a steady-state floating storage node voltage $V_{stdf}$ between the high voltage $V_{DD}$ and the ground voltage $V_{SS}$. The pull-up leakage current is usually dominant by the PMOSFET device 32 channel diffusion leakage current Ipch $(V_{DD}-V_{stdf})$ 320 while the pull-down leakage current is mainly from the reverse N-drain/P-substrate junction leakage current 342 for the drain electrode 341 of the access NMOSFET device 34. In FIG. 4, the pull-up leakage current curve 401 (dotted line) as the function of floating storage node voltage for the channel diffusion leakage current 320 of a PMOSFET device 32 monotonously decreases from the maximum high leakage current (2.28 pA) for the floating storage node voltage=0 V to the zero current for the floating storage node voltage=$V_{DD}$ below the reverse P-drain/Nwell junction leakage current 325. Meanwhile the pull-down leakage current curve 402 (solid line) as the function of floating storage node voltage for the reverse N-drain/P-substrate junction leakage current 342 from the drain electrode 341 of an access NMOSFET device 34 monotonously increases from zero current for the floating storage node voltage=0 V to the maximum high leakage current (2.31 pA) for the floating storage node voltage=$V_{DD}$. As illustrated in FIG. 4, the floating storage node voltage $V_f$ from the initially set 0 V with the maximum net pull-up leakage current difference $\Delta I_{LK}$>0 (the pull-up leakage current>the pull-down leakage current) evolves gradually slower and even slower paces (indicated by the arrow lengths) toward $V_{stdf}$ according to the net pull-up leakage current difference, where $V_{gp}$ denotes the gate voltage for the PMOSFET devices 31 and 32 and $V_{gn}$ denotes the gate voltage for the access NMOSFET devices 33 and 34. The steady-state floating storage node voltage $V_{stdf}$ can be obtained as the intersection point ($\Delta I_{LK}$=0) for the pull-up leakage curve (dotted line) 401 and the pull-down leakage curve (solid line) 402 shown in FIG. 4. The lower the pull-up leakage current curve 401 and the higher the pull-down leakage current curve 402, the lower the steady-state floating storage node voltage $V_{stdf}$ close to the ground voltage $V_{SS}$=0 V can be intersected. Therefore, in the 4T SRAM cell 300, the reduction of the channel diffusion leakage current 320 for PMOSFET devices 31, 32 and the increase of the reverse N-drain/P-substrate junction leakage current 342 of the drain electrodes 331, 341 for the access NMOSFET devices 33, 34 are the means to obtain a low steady voltage $V_{stdf}$ close to the ground voltage $V_{SS}$ for improving the read margin in 4T SRAM data storage.

The PMOSFET devices 31 and 32 with P-type source electrodes (311 and 321 in FIG. 3A) and drain electrodes (312 and 322 in FIG. 3A) are usually formed inside an N-type well (Nwell) (310 in FIG. 3A) embedded in the P-type silicon substrate for the CMOS process technology. For the normal digital circuit operation, the source electrodes and Nwells are usually biased with the high voltage rail $V_{DD}$ for SRAM cell arrays and other digital circuits. FIG. 5 shows the typical electrical I-V characteristics (gate voltage vs. drain current) for the PMOSFET devices 31 and 32 with high threshold voltages $V_{thH}$ (dotted line 503), regular threshold voltage $V_{thR}$ (solid line 502), low threshold voltage $V_{thL}$ (dashed line 501) provided by a foundry, where $V_{thH}$>$V_{thR}$>$V_{thL}$. With the PMOSFET devices 31 & 32 in the 4T SRAM cells 300 off for the gate voltage $V_{gp}$=source voltage $V_S$=Nwell voltage=$V_{DD}$, and the initial drain voltage $V_{drain}$=0 V, the initial maximum pull-up leakage currents are 0.33 pA, 7.9 pA, and 22 pA for high threshold voltage $V_{thH}$ device (dotted line 503), regular threshold voltage $V_{thR}$ device (solid line 502), and low threshold voltage $V_{thL}$ device (dashed line 501), respectively. Therefore according to the detailed leakage current balance principle illustrated in FIG. 4, the method of obtaining a low steady floating voltage $V_{stdf}$ close to the ground voltage $V_{SS}$ by the reduction of the pull-up leakage current is to apply the high threshold voltage PFET device for the storage PFET devices 31, 32 in the 4T SRAM cells 300.

FIG. 6 shows the typical electrical I-V characteristics (gate voltage vs. drain current) of the PMOSFET devices 31/32 with (1) 90% of the nominal channel (gate) length $L_{pn}$ (dotted line 601, top), (2) 100% of the nominal channel (gate) length $L_{pn}$ (solid line 602, middle), and (3) 110% of the nominal channel (gate) length $L_{pn}$ (dashed line 603, bottom) provided by a specific CMOS process technology node. With the PFET devices 31 & 32 in the 4T SRAM cells 300 off for the applied gate voltage=Nwell voltage=$V_{DD}$, and the initial drain voltage=0 V, the initial maximum pull-up leakage currents are 3.23 pA, 2.28 pA, and 1.86 pA for the PMOSFET devices with (1) 90% of the nominal channel (gate) length $L_{pn}$ (dotted line), (2) 100% of the nominal channel (gate) length $L_{pn}$ (solid line), and (3) 110% of the nominal channel (gate) length $L_{pn}$ (dashed line), respectively. Therefore, according to the detailed leakage current balance principle illustrated in FIG. 4, the method of obtaining a low steady floating voltage $V_{stdf}$ close to the ground voltage $V_{SS}$ by the reduction of the pull-up leakage current is to apply the storage PMOSFET devices with the channel (gate) length longer than the nominal channel (gate) length $L_{pn}$ provided by a specific CMOS process technology node for the storage PFET devices 31, 32 in the 4T SRAM cells 300.

FIG. 7 shows the typical electrical I-V characteristics (gate voltage vs. drain current) for a PMOSFET device 31/32 having Nwell 310 biased to the high voltage rail $V_{DD}$ and P-type source electrode 311/321 applied with (1) $V_S=V_{DD}$ (dashed line 701), (2) $V_S=V_{DD}-0.1V$ (solid line 702), and (3) $V_S=V_{DD}-0.2V$ (dotted line 703). As seen in FIG. 7 in the data retention time period, the storage PFET devices 31/32 in the 4T SRAM cells 300 with the Nwell 310 biased at the high voltage rail $V_{DD}$ and the drain electrode voltage initially set at 0 V, the initial maximum pull-up leakage currents are 2.29 pA, 0.068 pA, and 0.013 pA for the P-type source electrode 311/321 biased at (1) $V_S=V_{DD}$ (dashed line 701), (2) $V_S=V_{DD}-0.1V$ (solid line 702), and (3) $V_S=V_{DD}-0.2V$ (dotted line 703), respectively. Therefore according to the detailed leakage current balance principle illustrated in FIG. 4, the method of obtaining a low steady floating voltage $V_{stdf}$ close to ground voltage $V_{SS}$ by the reduction of pull-up leakage current is to apply the back-biased scheme for P-source electrodes 311 and 321 with a lower source voltage<$V_{DD}$ and Nwell 310 biased with the high voltage rail $V_{DD}$ for the storage PFET devices 31 and 32 in the 4T SRAM cells 300 in the data retention time period. Note that besides the above back-biased scheme, the alternative back-biased scheme for the reduction of the pull-up leakage current can be that Nwell 310 is applied with a higher voltage>$V_{DD}$ and the P-type source electrodes 311 and 321 are biased at the high voltage rail $V_{DD}$ for the PFET devices 31 and 32 in the 4T SRAM cells 300 in the data retention time period.

The reverse N-drain/P-substrate junction leakage current of the drain electrodes 331, 341 connected with the floating storage nodes N1, N2 for the access NFET devices 33, 34 in the 4T SRAM cell 300 is the main pull-down leakage current. To increase the pull-down leakage current for obtaining a low steady voltage $V_{stdf}$ close to ground voltage $V_{SS}$ is to increase the reverse N-drain/P-substrate junction leakage current of the drain electrodes 331, 341 connected with the floating storage nodes N1, N2 for the access NFET devices 33, 34 in 4T SRAM cell 300 in FIG. 3A. It is known that the reverse N/P junction leakage current can be increased with higher N/P junction impurity concentrations. Therefore the method of obtaining a low steady-state floating voltage $V_{stdf}$ close to the ground voltage $V_{SS}$ from the increase of pull-down leakage current is to increase the N-drain/P-substrate junction impurity concentrations of the drain electrodes 331, 341 for the access NFET device 33, 34 connected to the floating storage nodes N1, N2 in the 4T SRAM cell 300 in FIG. 3A. Meanwhile since the pull-down leakage current is approximately proportional to the N-drain/P-substrate junction areas, the N-drain/P-substrate junction area increase for the drain electrodes 331, 341 of the access NFET device 33, 34 connected to the floating storage nodes N1, N2 in the 4T SRAM cell 300 in FIG. 3A can also result in a higher pull-down leakage current for obtaining a low steady voltage $V_{stdf}$ close to the ground voltage.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and various MOSFET devices such as FinFET devices, and GAA (Gate All Around) devices may be made without departing from the scope of the present invention. Also, it is to be understood that the methods of embodiment are for the purpose of description and should not be regarded as limiting. Those of ordinary skill in the art will immediately realize that the embodiment of the present invention described herein in the context of methods and schematics are illustrative only and are not intended to be in any way limiting. Other embodiment of the present invention will readily suggest themselves to such skilled persons having the benefits of this disclosure.

Figure 8:
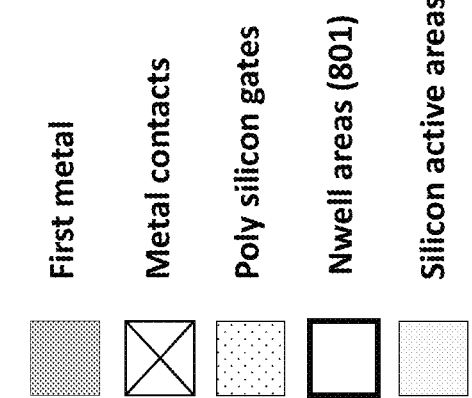
FIG. 8 shows the top view of two 4T SRAM cells and the high dosage impurity implant areas 801 for the high threshold storage PMOSFET devices in the two 4T SRAM cells according to one embodiment of the invention.
Figure 8:
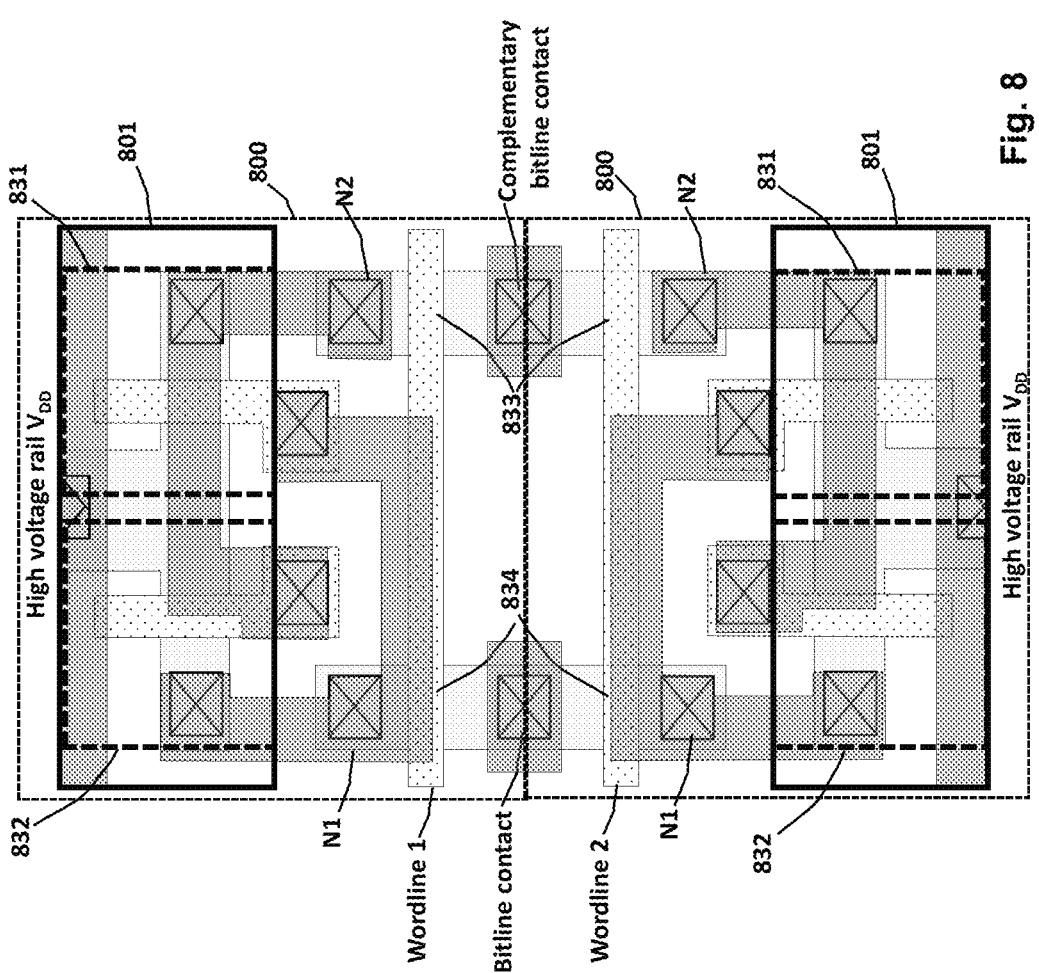

In one embodiment, the high threshold voltage PMOSFET devices with low channel diffusion leakage currents are applied for the storage PMOSFET devices in the 4T SRAM cells for the reduction of pull-up leakage current. FIG. 8 shows the top view of two horizontally mirrored 4T SRAM cells 800 (up/down) according to the topology design rules from a specific CMOS logic process technology node provided by a foundry. In FIG. 8, each 4T SRAM cell 800 includes two PMOSFET devices 831 and 832 and two access NMOSFET devices 833 and 834. To obtain the high threshold voltage storage PFET devices 831 and 832 in the 4T SRAM cells 800, the higher dosages ($10^{12}$ cm$^{-2}$~$10^{14}$ cm$^{-2}$) of N-type impurities such as arsenic or phosphorous are implanted into the silicon active areas of the Nwell areas 801 in the 4T SRAM cells 800 shown in FIG. 8.

Figure 9:
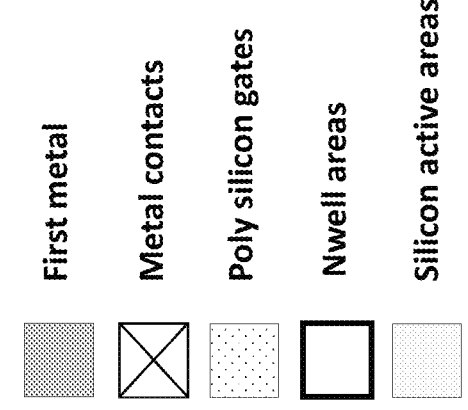
FIG. 9 shows the top view of two 4T SRAM cells for the storage PMOSFET devices with a channel (gate) length $L_p$ longer than the nominal channel (gate) length $L_{pn}$ from a CMOS process technology node according to one embodiment of the invention.
Figure 9:
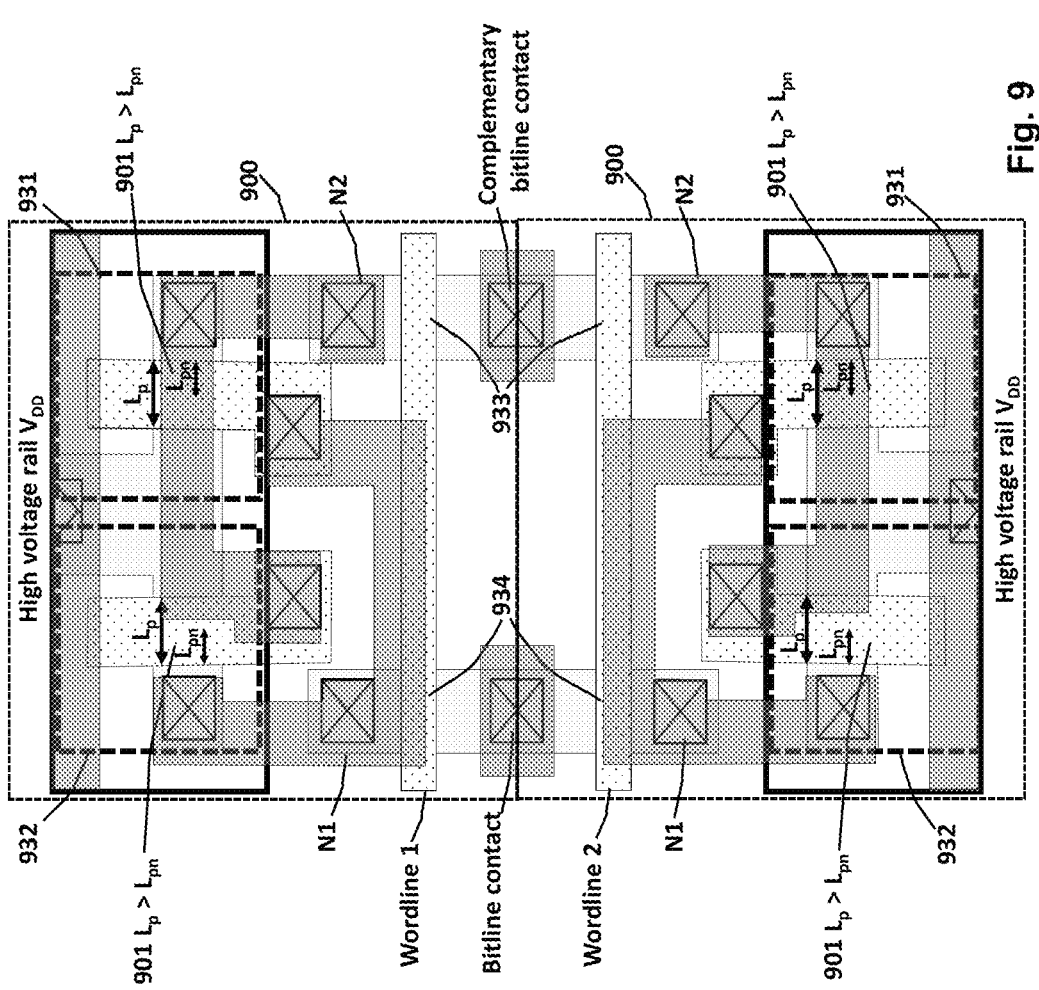

In one embodiment, the PMOSFET devices with channel (gate) lengths $L_p$ longer than the nominal channel (gate) length $L_{pn}$ from a CMOS process technology node provided by a foundry are applied for the storage PMOSFET devices in the 4T SRAM cells for the reduction of pull-up leakage current. FIG. 9 shows the top view of two horizontally mirrored 4T SRAM cells (up/down) 900 with two storage PMOSFET devices 931 and 932 having channel (gate) length $L_p$ 901 longer than the nominal (gate) length $L_{pn}$ provided by a specific CMOS process technology node. For example, if a nominal channel (gate) length $L_{pn}$=40 nm for the 40 nm CMOS process technology node, the channel (gate) length $L_p$ 901 is greater than or equal to ($1.1{\times}L_{pn}$), such as 45 nm.

Figure 1:
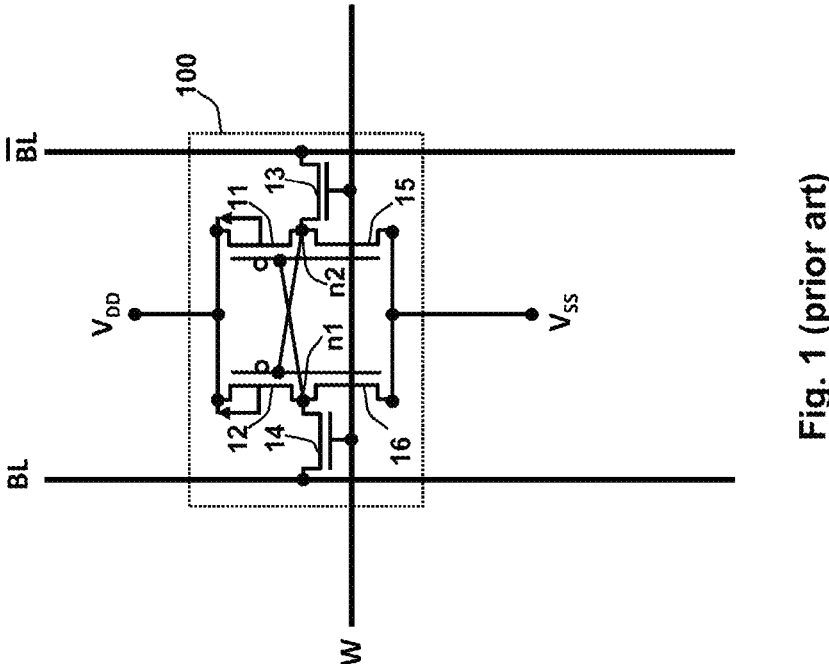
FIG. 1 shows the schematic of the conventional 6T-SRAM.
Figure 2:
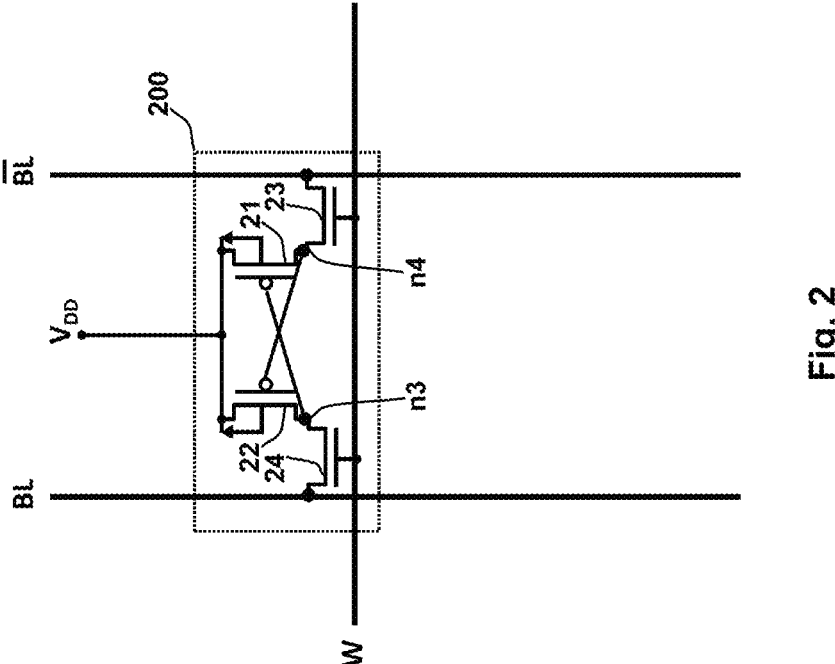
FIG. 2 shows the schematic of 4T-SRAM.
Figure 3A:
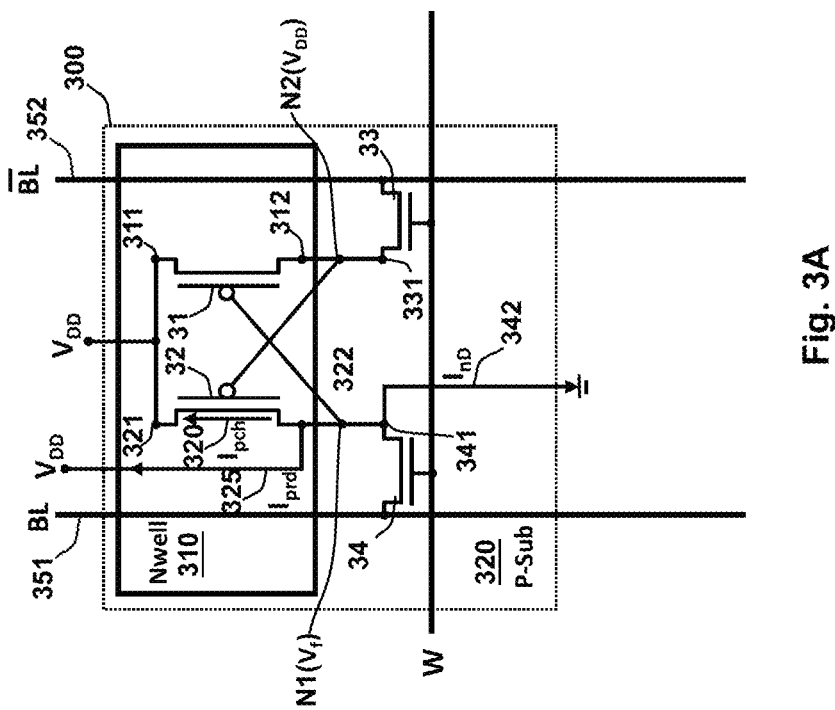
FIG. 3A illustrates the pull-up leakage current and the pull-down leakage current for the floating storage node N1 of 4T SRAM cell 300 in the data retention period.
Figure 3B:
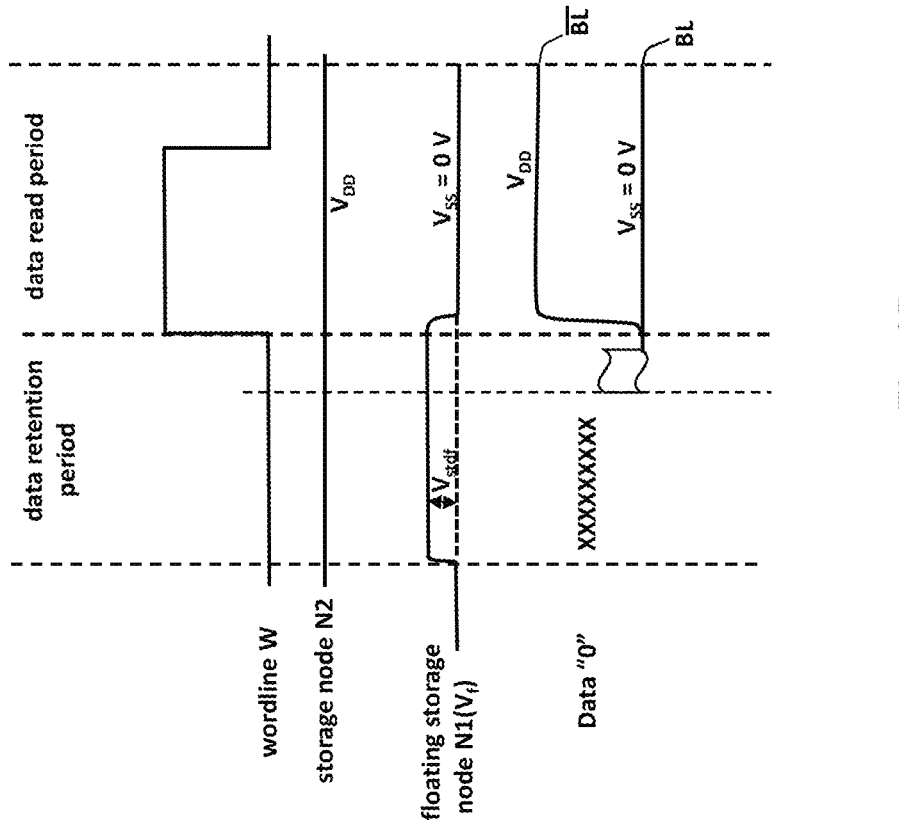
FIG. 3B shows the voltage timing sequence diagram for the bit lines BL and BL, storage nodes N1 and N2 and the wordline W for the 4T SRAM cell 300 in a data retention period and a data read period.
Figure 4:
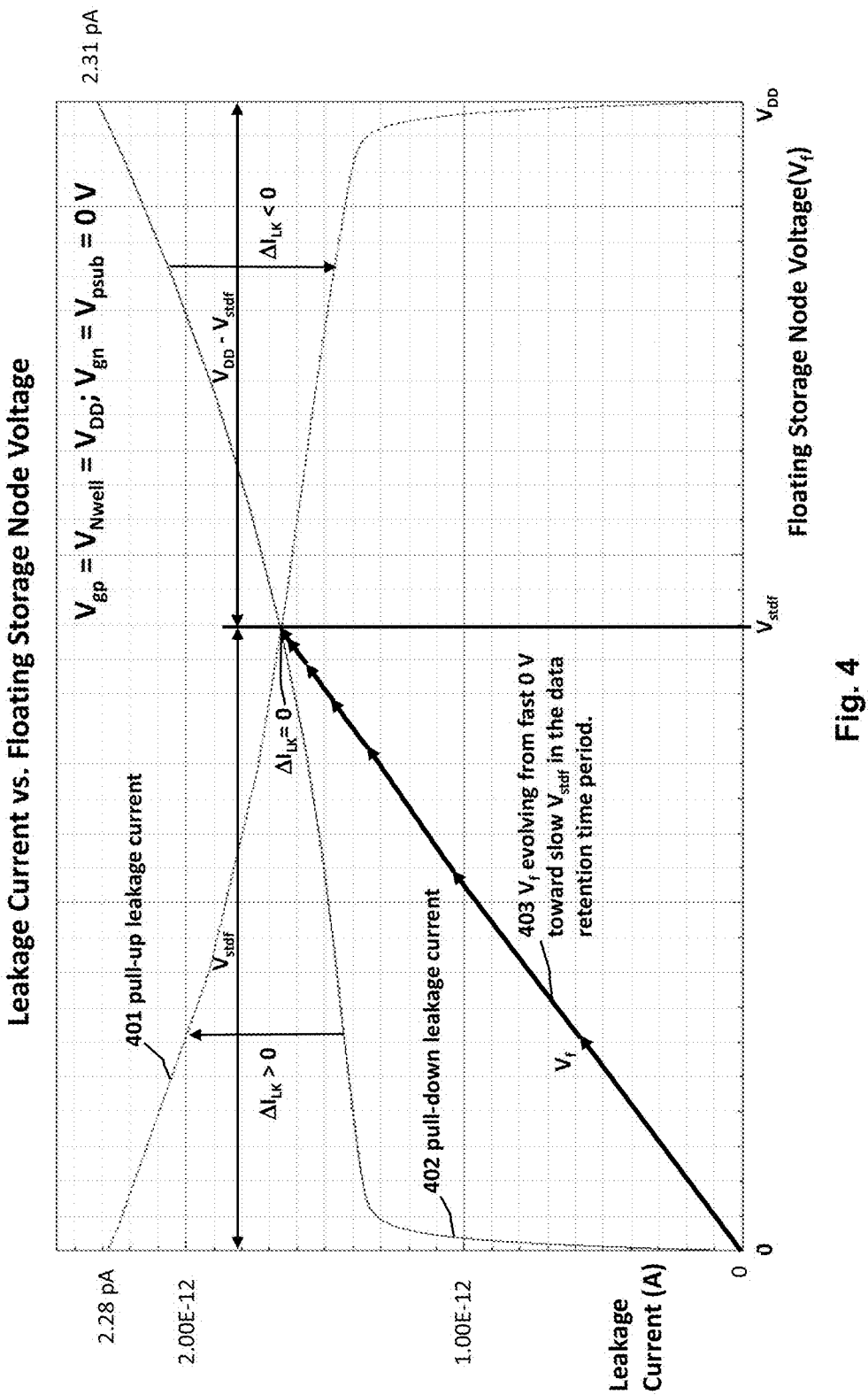
FIG. 4 shows the steady-state floating storage node voltage versus the pull-up leakage current from the PMOSFET device channel diffusion current and the pull-down leakage current from the reverse N-drain/P-substrate junction leakage current of the access NMOSFET device in the 4T SRAM cell.
Figure 5:
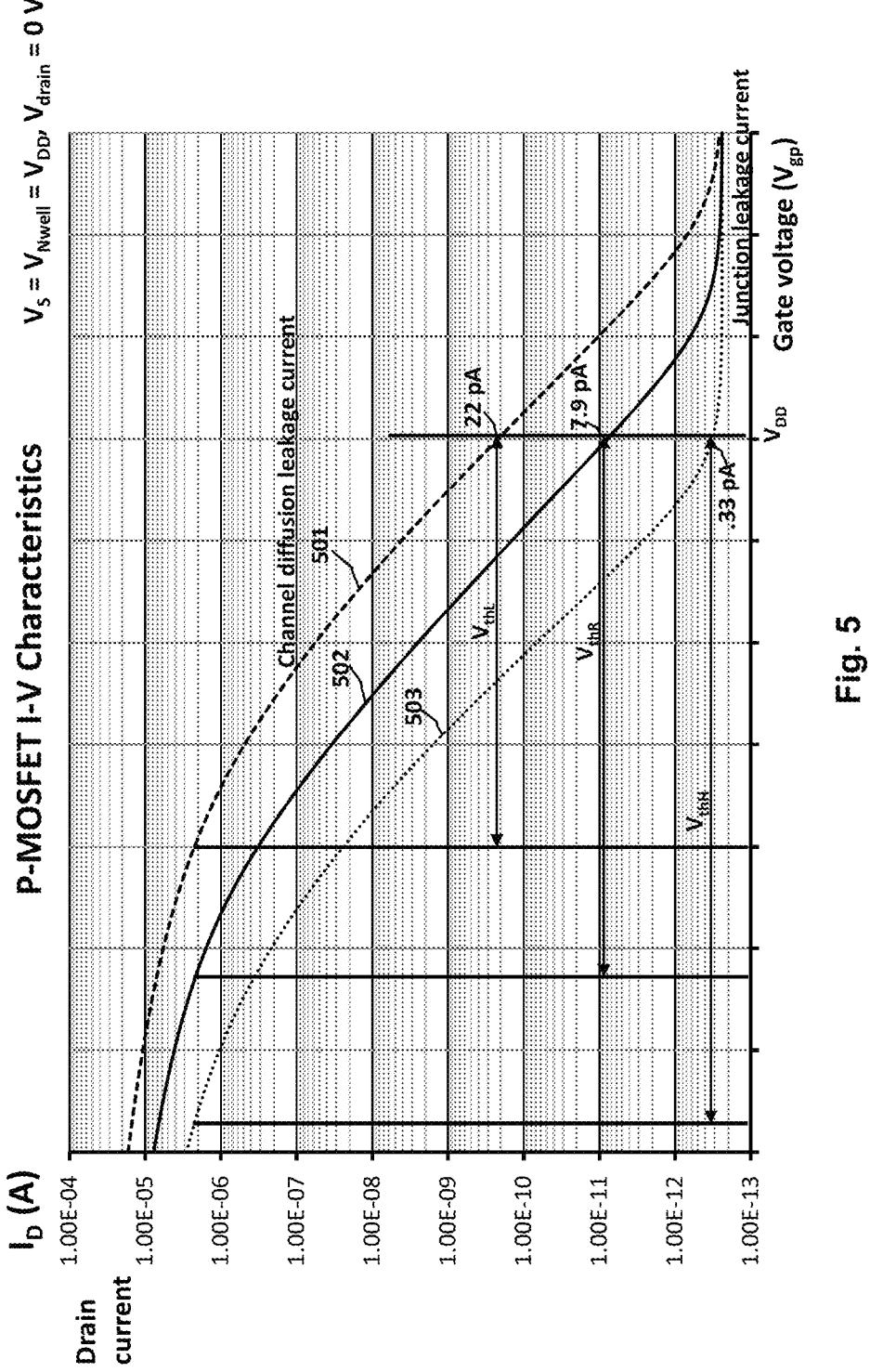
FIG. 5 shows PMOSFET device electrical characteristics of drain current versus the applied gate voltage for high threshold voltage $V_{thH}$ PMOSFET device (dotted line 503), regular threshold voltage $V_{thR}$ PMOSFET device (solid line 502), and low threshold voltage $V_{thL}$ PMOSFET device (dashed line 501) from the CMOS process technology provided by a foundry.
Figure 6:
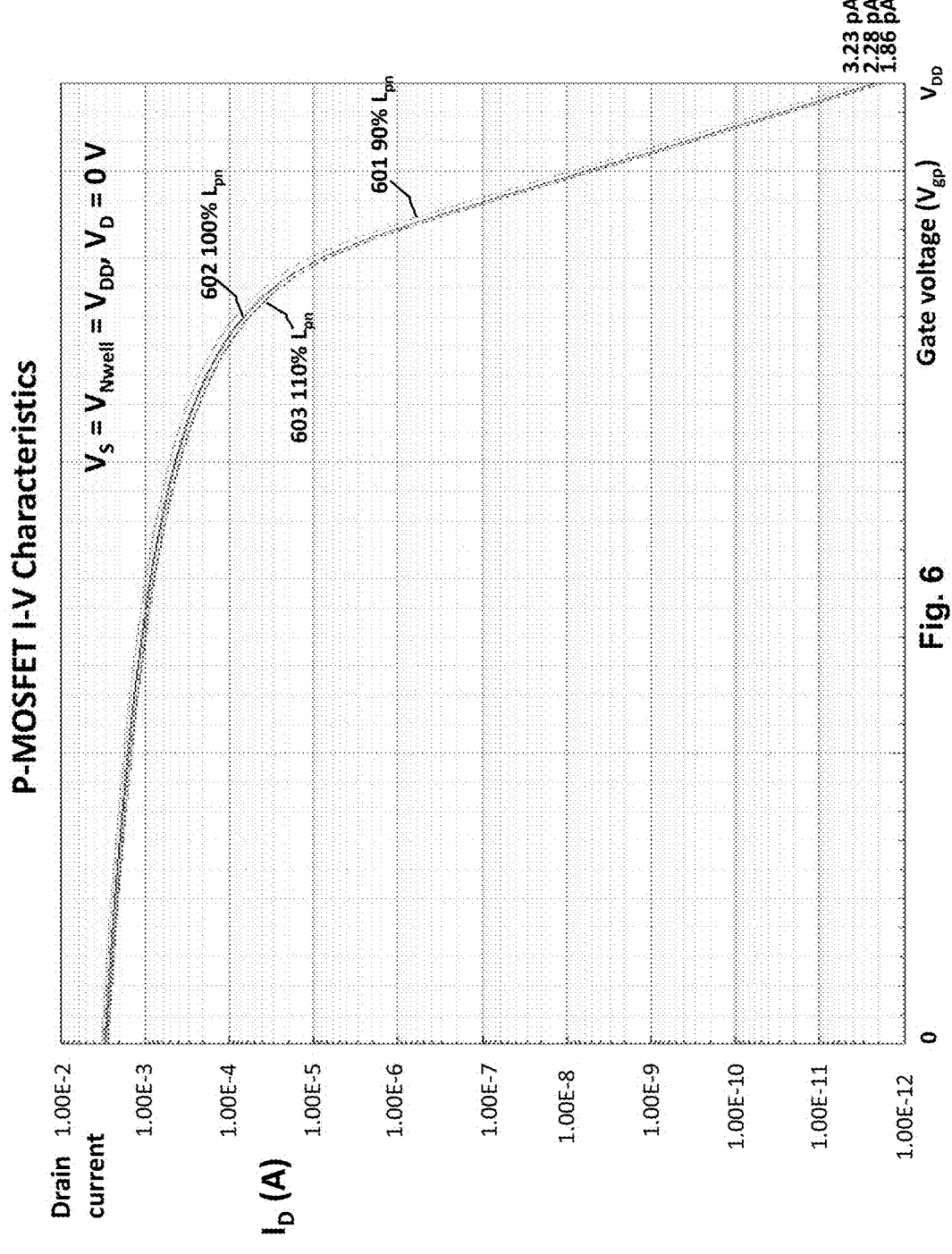
FIG. 6 shows electrical characteristics of drain current versus the applied gate voltage for PMOSFET devices with (1) 90% of the nominal channel (gate) length $L_{pn}$ (dotted line 601), (2) 100% of the nominal channel (gate) length $L_{pn}$ (solid line 602), and (3) 110% of the nominal channel (gate) length $L_{pn}$ (dashed line 603) from the CMOS process technology provided by a foundry.
Figure 7:
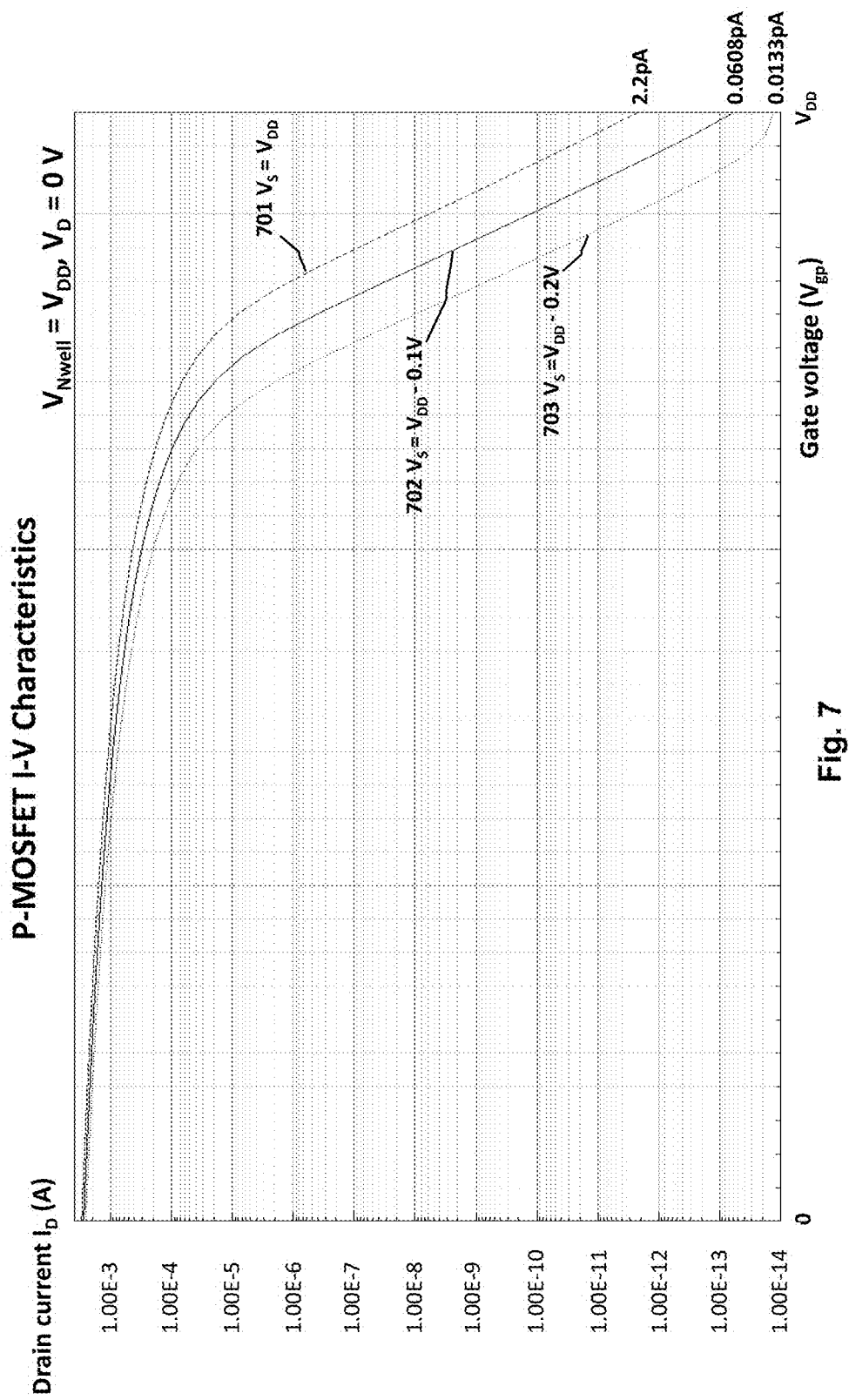
FIG. 7 shows the PMOSFET device electrical characteristics of drain current versus applied gate voltage with Nwell 310 biased at the high voltage rail $V_{DD}$ and the source electrode 311/321 applied with (a) $V_{DD}$ (dashed line 701), (b) $V_{DD}-0.1V$ (solid line 702), and (c) $V_{DD}-0.2V$ (dotted line 703).
Figure 10:
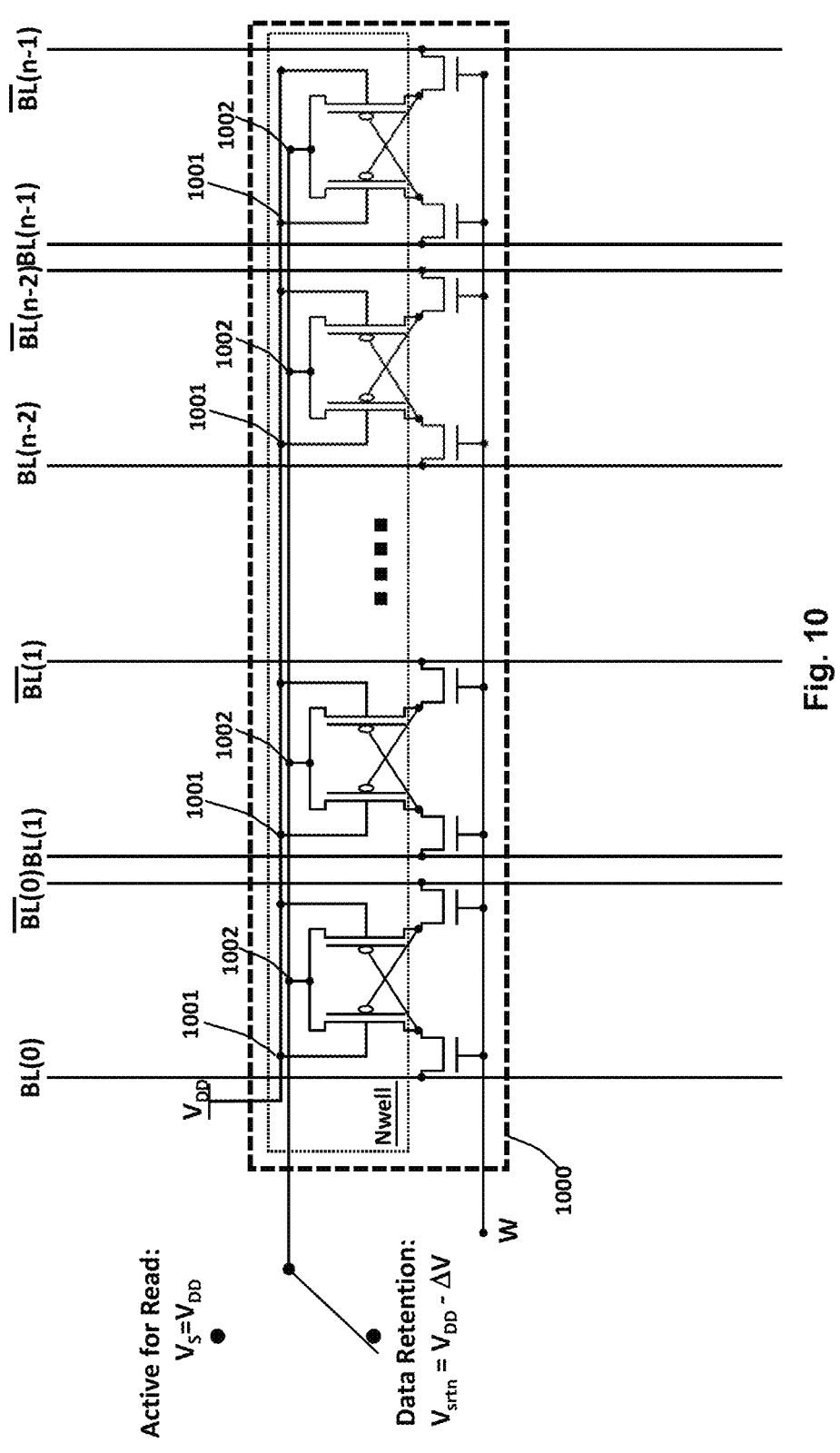
FIG. 10 shows the circuit schematic of the back-biased scheme for the PMOSFET devices in a row of 4T SRAM cells according to one embodiment of the invention.

In one embodiment, the 4T SRAM cell arrays are fabricated with a CMOS process technology node. FIG. 10 shows a schematic diagram of a circuit for a row of "n" 4T SRAM cells 1000 in the configuration of cell array based on the back-biased scheme for reducing the pull-up leakage current (PMOSFET device channel diffusion leakage current). In FIG. 10, with the Nwell 1001 biased at $V_{DD}$, the source electrodes 1002 of the storage PMOSFET devices for the row of 4T SRAM cells 1000 is applied with the voltage $V_{srtn}$=($V_{DD}$−$\Delta V$) in data retention period (such as the data retention period in FIG. 3B), where $\Delta V$ is a positive voltage bias less than $V_{DD}$. When the row of "n" 4T SRAM cells 1000 is active for read operations (such as the data read period in FIG. 3B), the voltage potential at the source electrodes 1002 of the storage PMOSFET devices for the row of "n" 4T SRAM cells 1000 is resumed from the voltage $V_{srtn}$ to the normal operational voltage $V_{DD}$ with the Nwell 1001 still biased at $V_{DD}$ as illustrated on the left side of FIG. 10.

Figure 11:
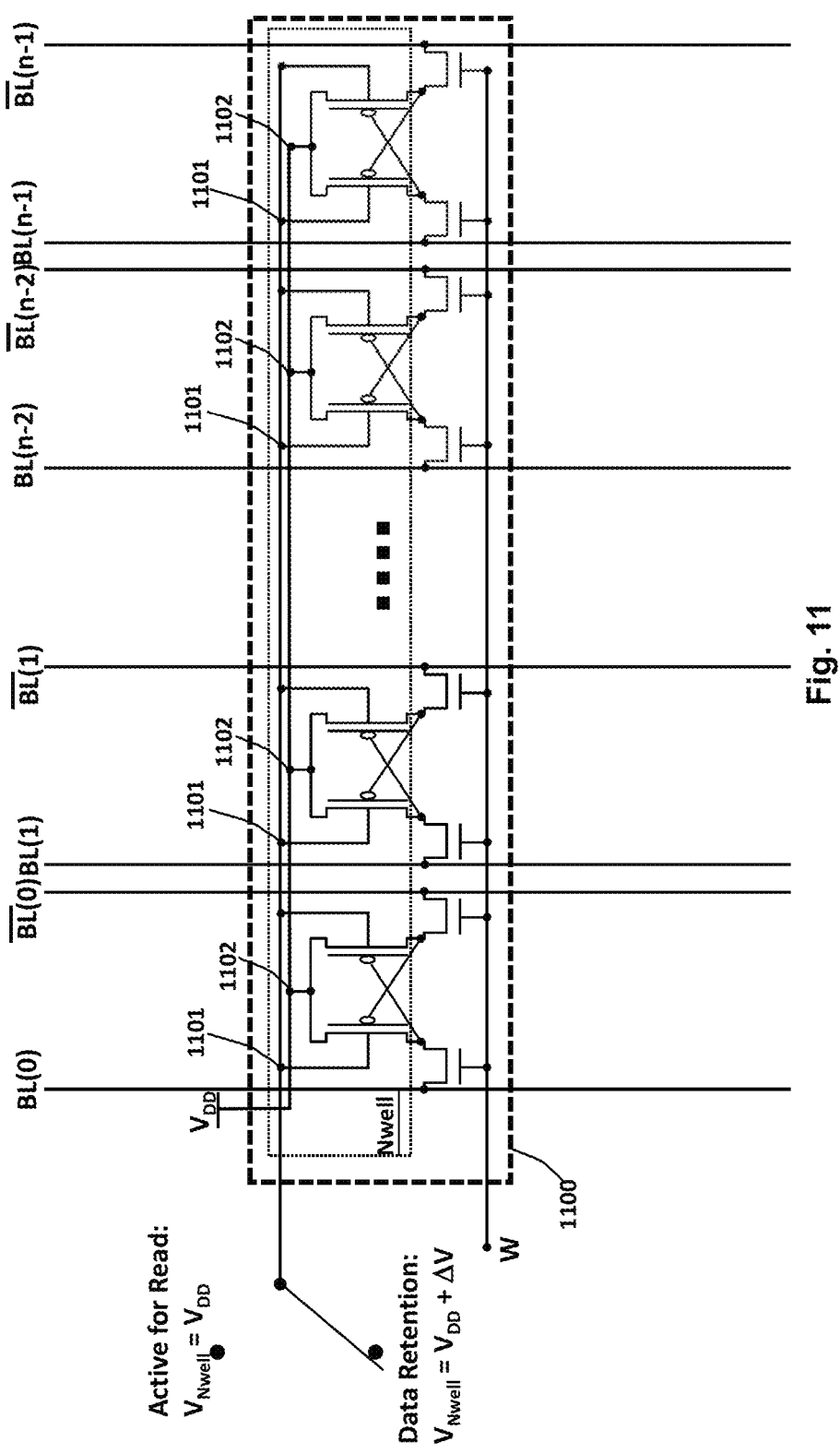
FIG. 11 shows the circuit schematic of the alternative back-biased scheme for the PMOSFET devices in a row of 4T SRAM cells according to another embodiment of the invention.

In one embodiment, the 4T SRAM cell arrays are fabricated with a CMOS process technology node. FIG. 11 shows a schematic diagram of a circuit for a row of "n" 4T SRAM cells 1100 in the configuration of cell array based on the alternative back-biased scheme for reducing the pull-up leakage current (PMOSFET device channel diffusion leakage current). In FIG. 11, the source electrodes 1102 of the storage PMOSFET devices for the row of 4T SRAM cells 1100 are biased at the high voltage rail $V_{DD}$ and the Nwell voltage potential $V_{Nwell}$ for the Nwell 1101 is applied with the high voltage $V_{HNW}$=($V_{DD}$+$\Delta V$) in data retention period (i.e., two NMOSFET devices are turned off), where $\Delta V$ is a positive voltage bias less than $V_{DD}$. When the row of "n" 4T SRAM cells 1100 is active for read operations (i.e., two NMOSFET devices are turned on), the Nwell voltage potential $V_{Nwell}$ of the Nwell 1101 for the row of "n" 4T SRAM cells 1100 is then reduced from the high voltage $V_{HNW}$ to the read operational high voltage $V_{DD}$ with the source electrodes 1102 still biased at $V_{DD}$ as illustrates on the left side of FIG. 11.

Figure 12A:
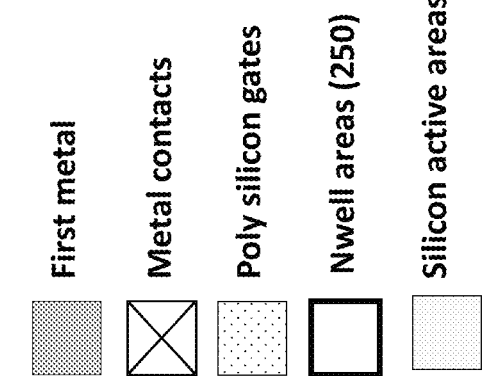
FIG. 12A shows the top view of two 4T SRAM cells and the high dosage impurity implant areas 1210 for obtaining higher junction leakage current for the drain electrodes of access NMOSFET devices in 4T SRAM according to one embodiment of the invention.
Figure 12A:
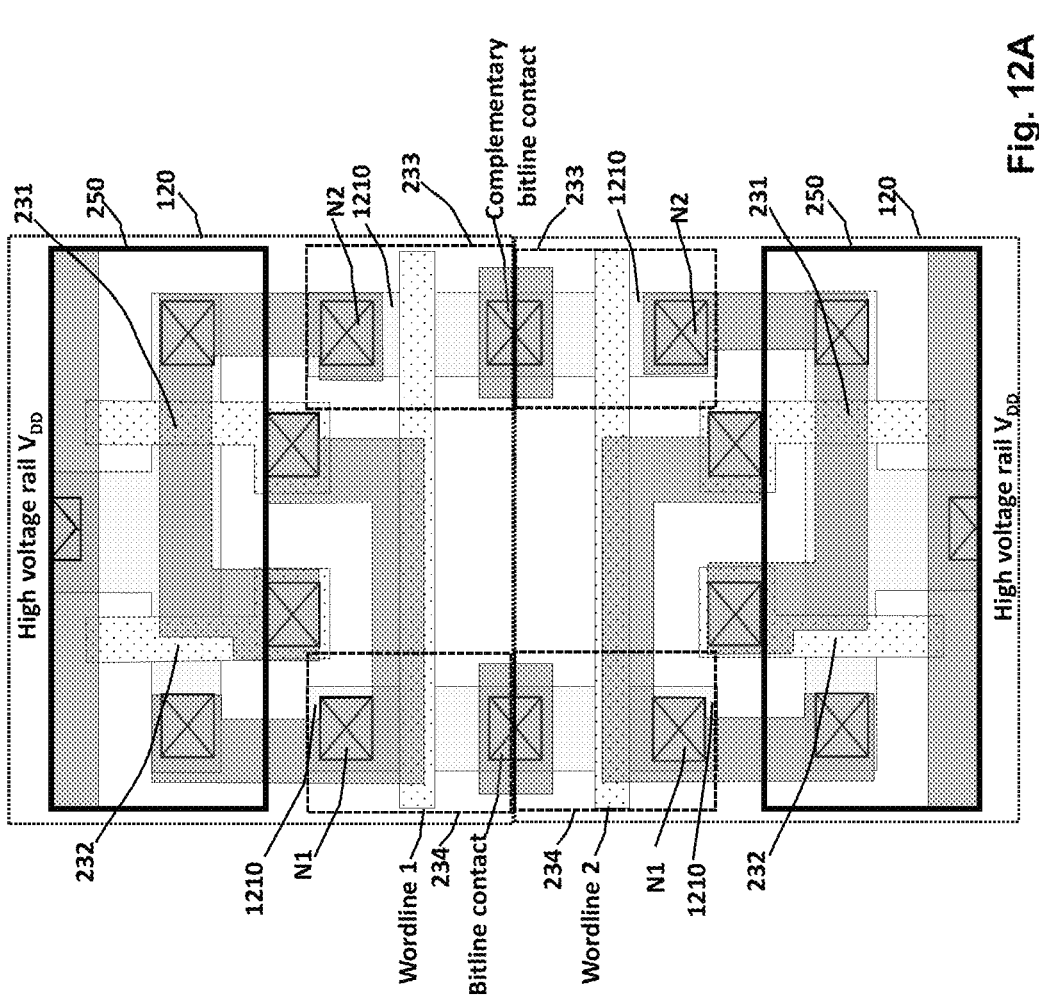
Figure 12B:
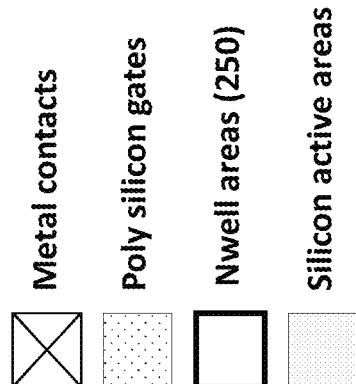
FIG. 12B shows the top view of two 4T SRAM cells in FIG. 12A before the first metals are formed.
Figure 12B:
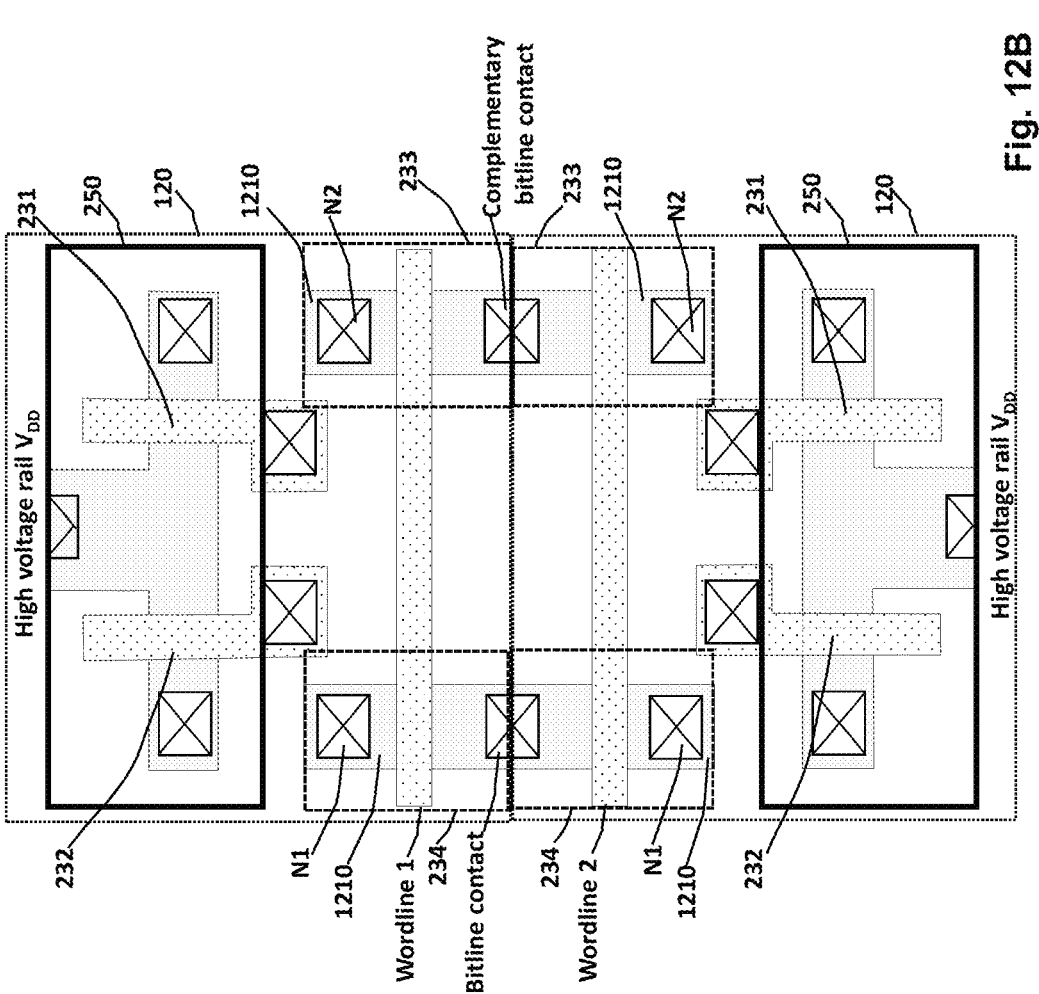

To increase the pull-down leakage current in 4T SRAM cells for obtaining a low steady-state floating storage node voltage $V_{stdf}$ close to the ground voltage $V_{SS}$ is to increase the reverse N-drain/P-substrate junction leakage current for the drain electrodes of the access NMOSFET devices connected to the storage nodes in the 4T SRAM cells, such as, by increasing N/P junction impurity concentrations. In one embodiment, each of the two 4T SRAM cells 120 includes two PMOSFET devices 231 and 232 and two access NMOSFET devices 233 and 234; there are three ways as follows to form the high leakage N-drain/P-substrate junctions (i.e., to increase N/P junction impurity concentrations) for the drain electrodes of the access NFET devices 233 and 234 as shown in FIGS. 12A-12B: (1) the high dosages ($10^{13}$ cm$^{-2}$~$10^{15}$ cm$^{-2}$) of P-type impurities for the P-type substrate are implanted into the silicon active areas 1210 (surrounding drain electrode areas of two access NFET devices 233 and 234) of the two 4T SRAM cells (top/down cells) 120; (2) the high dosages ($10^{13}$ cm$^{-2}$~$10^{15}$ cm$^{-2}$) of N-type impurities for the N-type drain electrodes are implanted into the silicon active areas 1210 (i.e., drain electrode areas of two access NFET devices 233 and 234) of the two 4T SRAM cells (top/down cells) 120; (3) both (the above two high dosages of P-type impurities and N-type impurities) are implanted into the silicon active areas 1210 (surrounding and including drain electrode areas of two access NFET devices 233 and 234).

Figure 13A:
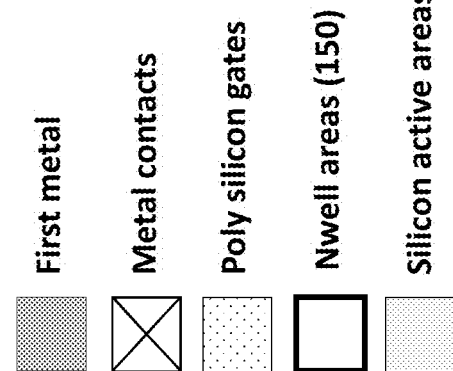
FIG. 13A shows the top view of two 4T SRAM cells and the access NMOSFET devices with the enlarged N-drain/P-substrate junction areas 1311 for the increase of pull-down leakage current according to one embodiment of the invention.
Figure 13A:
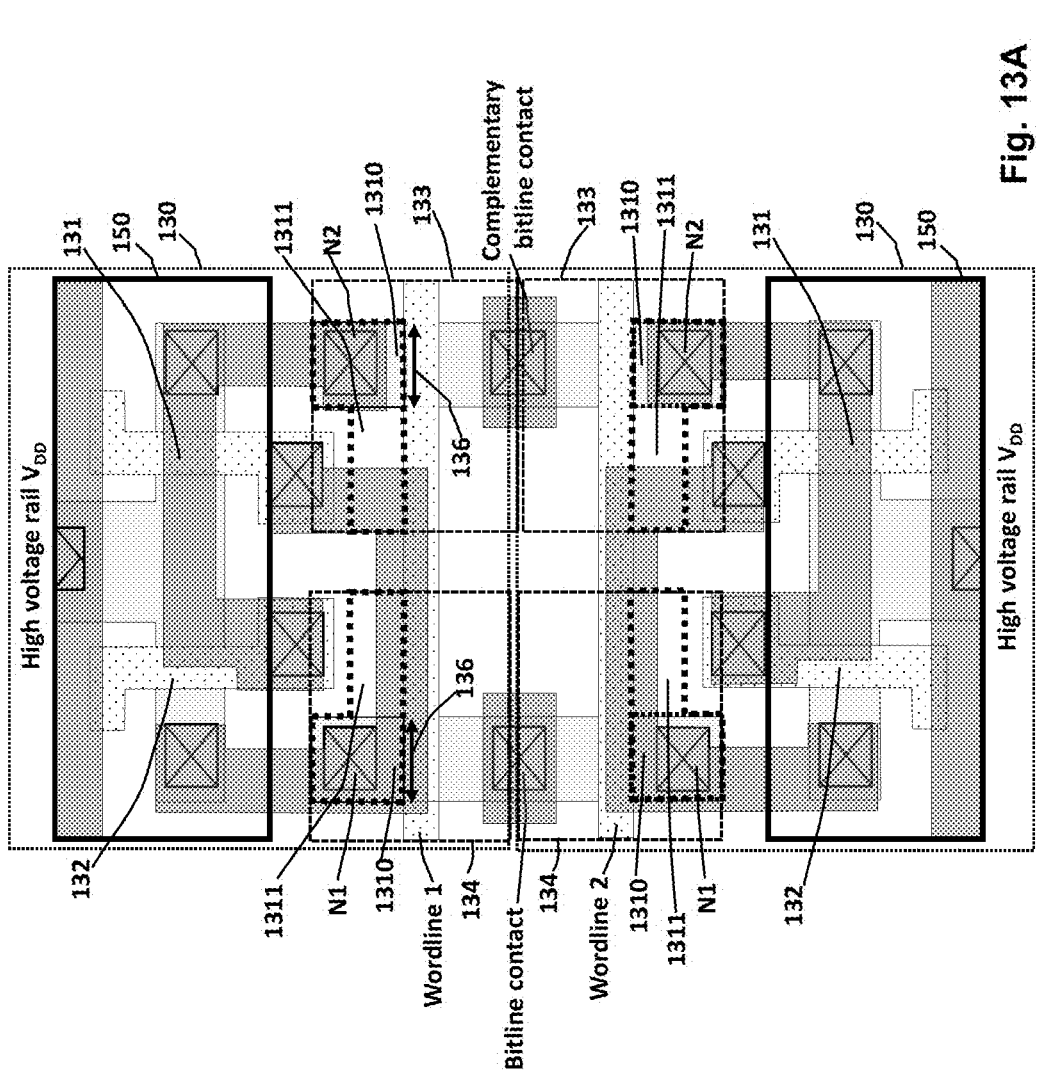
Figure 13B:
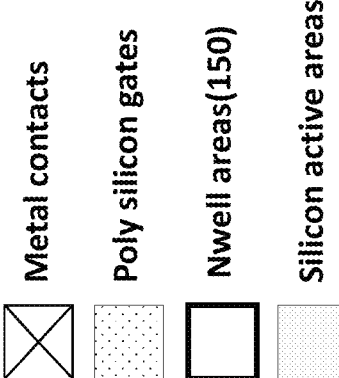
FIG. 13B shows the top view of two 4T SRAM cells in FIG. 13A before the first metals are formed.
Figure 13B:
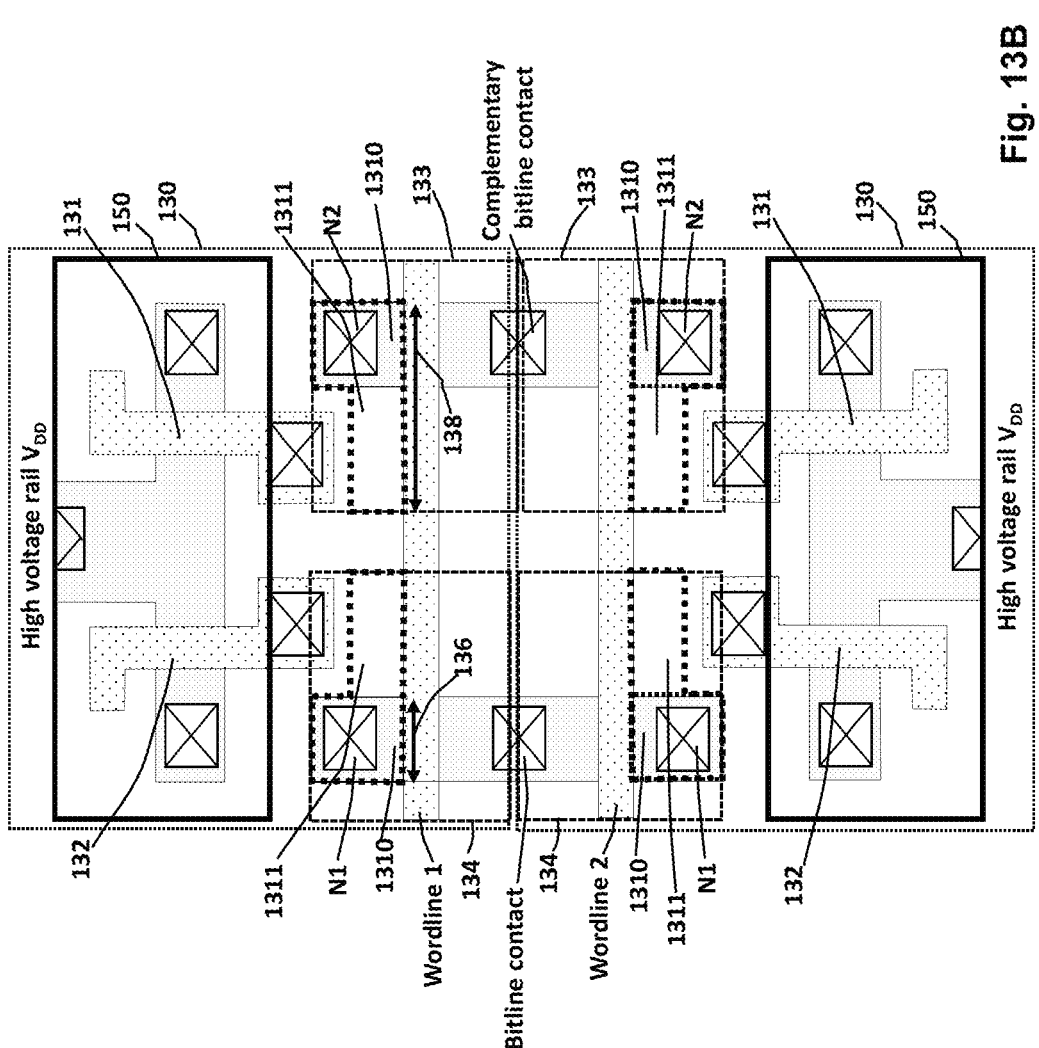

To increase the pull-down leakage current in 4T SRAM cells for obtaining a low steady-state floating storage node voltage $V_{stdf}$ close to the ground voltage $V_{SS}$ is to increase the reverse N-drain/P-substrate junction leakage current for the drain electrodes of the two access NMOSFET devices connected to the two storage nodes in 4T SRAM cells, such as, by increasing N/P junction areas. In one embodiment, the drain electrode areas for the access NMOSFET devices in 4T SRAM cells are enlarged to increase the pull-down leakage current for obtaining a low steady-state floating storage node voltage $V_{stdf}$. In FIGS. 13A-13B, each 4T SRAM cell 130 includes two PMOSFET devices 131 and 132 and two access NMOSFET devices 133 and 134; a drain width 138 of the enlarged drain electrode areas 1311 (represented by the large dotted lines) of the access NFET devices 133 and 134 in 4T SRAM cells 130 is increased from the minimum device drain width (equal to the channel width) 136 of the original drain electrode area 1310 (represented by the thin solid lines) for increasing the pull-down leakage current, where the drain width 138 is greater than the minimum device drain width 136. The enlarged drain electrode areas 1311 are located among and isolated from the Nwell areas 150, the gates of PFET devices 131 and 132 and the wordlines 1 and 2 of the access NFET devices 133 and 134. Thus, the largest size of the enlarged drain electrode areas 1311 depends on the topology design rule limitation of a specific CMOS process technology node. A size of the enlarged drain electrode areas 1311 are greater than that of the original drain electrode areas 1310. In an embodiment, a size of the enlarged drain electrode areas 1311 are approximately two times greater than that of the original drain electrode areas 1310.

The aforementioned description of the preferred embodiment of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiment and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiment of the invention. It should be appreciated that variations may be made in the embodiment described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A static random access memory (SRAM) cell comprising:

a cross-coupled pair of PMOS transistors coupled to a supply voltage rail, a first storage node and a second storage node; and two NMOS transistors coupled to a word line, the first and the second storage nodes and a bit line pair;

wherein when the two NMOS transistors are turned off, a floating voltage at the first storage node rises from a ground voltage and stabilizes at a steady-state voltage $V_{stdf}$ and a difference voltage ($V_{DD}-V_{stdf}$) between the first and the second storage nodes is greater than a predefined voltage so that a data bit stored in the SRAM cell is read out correctly in a following data read period; and wherein $V_{DD}$ denotes a supply voltage at the second storage node and $0 < V_{stdf} < V_{DD}$.

2. The SRAM cell according to claim 1, wherein a differential voltage between the bit line pair is related to a capacitance ratio for the bit line pair and the first and the second storage nodes.

3. The SRAM cell according to claim 2, wherein when the capacitance ratio for the bit line pair and the first and the second storage nodes is 10:1, the predefined voltage is 100 millivolts.

4. The SRAM cell according to claim 2, wherein the differential voltage between the bit line pair is fractions of $V_{DD}$ when the two NMOS transistors are turned on.

5. The SRAM cell according to claim 1, wherein the steady-state voltage $V_{stdf}$ close to the ground voltage is obtained by at least one of decreasing a pull-up leakage current curve for the cross-coupled pair of PMOS transistors and increasing a pull-down leakage current curve for the two NMOS transistors.

6. The SRAM cell according to claim 5, wherein each of the pull-up leakage current curve and the pull-down leakage current curve is a function of the floating voltage at the first storage node.

7. The SRAM cell according to claim 5, wherein silicon active areas of an N-type well (Nwell) region of the cross-coupled pair of PMOS transistors are implanted with dosages of N-type impurities of $10^{12}$ $cm^{-2}$ to $10^{14}$ $cm^{-2}$ to form the cross-coupled pair of PMOS transistors with a high threshold voltage so that the pull-up leakage current curve is decreased.

8. The SRAM cell according to claim 5, wherein the SRAM cell is fabricated from a specific CMOS process technology node with a nominal channel length, and wherein each of the cross-coupled pair of PMOS transistors has a channel length longer than the nominal channel length so that the pull-up leakage current curve is decreased.

9. The SRAM cell according to claim 5, wherein silicon active areas surrounding drain regions of the two NMOS transistors are implanted with dosages of P-type impurities of $10^{13}$ $cm^{-2}$ to $10^{15}$ $cm^{-2}$ for a P-type substrate so that the pull-down leakage current curve is increased.

10. The SRAM cell according to claim 5, wherein silicon active areas of drain regions of the two NMOS transistors are implanted with dosages of N-type impurities of $10^{13}$ $cm^{-2}$ to $10^{15}$ $cm^{-2}$ for N-type drain regions of the two NMOS transistors so that the pull-down leakage current curve is increased.

11. The SRAM cell according to claim 5, wherein each of the two NMOS transistors has an enlarged drain region located among the word line, an Nwell region and gate regions of the cross-coupled pair of PMOS transistors, where a size of the enlarged drain region is greater than that of an original drain region so that the pull-down leakage current curve is increased, and wherein a width of the original drain region is equal to a channel width of each of the two NMOS transistors.

12. The SRAM cell according to claim 5, wherein when the two NMOS transistors are turned off, a Nwell region of the cross-coupled pair of PMOS transistors is connected to the supply voltage rail and source regions of the cross-coupled pair of PMOS transistors are applied with a first voltage less than the supply voltage so that the pull-up leakage current curve is decreased.

13. The SRAM cell according to claim 12, wherein in the following data read period, the two NMOS transistors are turned on and the source regions of the cross-coupled pair of PMOS transistors are applied with the supply voltage.

14. The SRAM cell according to claim 5, wherein when the two NMOS transistors are turned off, source regions of the cross-coupled pair of PMOS transistors are connected to the supply voltage rail and a Nwell region of the cross-coupled pair of PMOS transistors is applied with a second voltage greater than the supply voltage so that the pull-up leakage current curve is decreased.

15. The SRAM cell according to claim 14, wherein in the following data read period, the two NMOS transistors are turned on and the Nwell region of the cross-coupled pair of PMOS transistors is applied with the supply voltage.

* * * * *